(12) United States Patent
Tanaka

(10) Patent No.: US 7,124,592 B2
(45) Date of Patent: Oct. 24, 2006

(54) TEMPERATURE CONTROLLING CIRCUIT FOR A SEMICONDUCTOR LIGHT-EMITTING DEVICE

(75) Inventor: Keiji Tanaka, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 299 days.

(21) Appl. No.: 10/911,732

(22) Filed: Aug. 5, 2004

(65) Prior Publication Data

US 2005/0109041 A1    May 26, 2005

(30) Foreign Application Priority Data

Aug. 5, 2003    (JP)    ............... 2003-286938

(51) Int. Cl.
*F25B 21/02* (2006.01)
*H01S 3/04* (2006.01)

(52) U.S. Cl. ............... 62/3.2; 62/3.3; 62/3.7; 372/34; 372/35; 372/38.02; 372/38.07

(58) Field of Classification Search ............... None
See application file for complete search history.

(56) References Cited

U.S. PATENT DOCUMENTS

| | | |
|---|---|---|
| 4,631,728 A | 12/1986 | Simons |
| 5,602,860 A | 2/1997 | Masonson |
| 6,519,949 B1 * | 2/2003 | Wernlund et al. ............... 62/3.7 |
| 2003/0152390 A1 * | 8/2003 | Stewart et al. ............... 398/135 |

FOREIGN PATENT DOCUMENTS

JP    59-224931    12/1984

* cited by examiner

*Primary Examiner*—Tuyet Thi Vo
(74) *Attorney, Agent, or Firm*—McDermott Will & Emery LLP

(57) ABSTRACT

The present invention provides a temperature control circuit for a semiconductor light-emitting device, in which scale of the circuit is not enlarged and noise due to the current switching is not generated. In the temperature control circuit of the present invention, although the DC voltage $V_{ATC}$ supplied to the Peltier device is generated by the DC-to-DC converting from the external power $V_{CC}$, the DC voltage $V_{ATC}$ is feedback controlled so as to coincide with a target value of the DC voltage that is set based on an error signal generated by detecting a voltage drop of the Peltier device and comparing this drop voltage with a reference voltage. A control signal for setting the temperature of the laser diode to the target temperature through heating up or cooling down the Peltier device by flowing a current corresponding to an error between the target temperature and a practical temperature detected by the thermistor in the Peltier device from the thermoelectric controller current driver.

12 Claims, 5 Drawing Sheets

TEMPERATURE CONTROLLING CIRCUIT FOR A SEMICONDUCTOR LIGHT-EMITTING DEVICE

BACKGROUND OF THE INVENTION

1. Field of the Invention

The present invention relates to a control circuit for a light-emitting device, in particular, the invention relates to a control circuit to control a temperature of the light-emitting device such as semiconductor laser diode, by monitoring the temperature thereof, to an optimum condition.

2. Related Prior Art

Various techniques to optimize the temperature of the laser diode by monitoring the temperature thereof have been disclosed in the U.S. Pat. No. 4,631,728 and Japanese patent published as S59-224931.

The control circuit recited in the former material is that the temperature of the laser diode is kept constant by a thermoelectric device, i.e., a signal corresponding to the temperature of the laser diode sensed by a temperature sensor is amplified and thus amplified signal is compared with a reference voltage by an integration circuit. An output from the integration circuit controls a pulse width modulation circuit (hereinafter referred as PWM), and the PWM circuit drives a switching transistor that varies a pulse width of a supply voltage via a filtering circuit. Thus filtered supply voltage is provided to a mode controller. The mode controller, under the control of the integration circuit, switches a direction of current flowing. The supply voltage is applied to the thermoelectric device to keep the temperature of the laser diode constant.

The control circuit according to the latter reference includes (1) a thermoelectric conversion block where a temperature of a thermoelectric device, capable of both heating and cooling by the direction of current flowing, is detected and converted to an electric signal, (2) a comparing block for comparing thus converted electric signal with a reference signal, and (3) a voltage-to-current conversion block for driving the thermoelectric device in a current mode. The voltage-to-current conversion block includes an npn-transistor and a pnp-transistor, and is connected in its input terminal to an output terminal of the comparing block. Further, between the input terminal of the voltage-to-current conversion block and bases of both the npn-transistor and the pnp-transistor are provided level shift circuits, respectively.

Since the supply voltage is controlled by the PWM mode, the former control circuit has an advantage in power efficiency. Operating under the ideal condition with no loss in devices, the power efficiency of 100% would be achieved. Practically, the power efficiency from 85% to 86%, as denoted by a symbol B in FIG. 3 later shown, would be achievable due to impedance of the switching transistor and inductors. Further, the integration circuit is necessary to reduce a switching noise as shown in FIG. 1. When the driving current is flew in bi-directional for heating and cooling, two integration circuits must be installed. In particular, when a large driving current is necessary, integration circuits that include a large inductor and a large capacitor would be necessary, thereby causing an increment of the size of the circuit assembly.

On the other hand, in the control circuit of the latter reference, since the current flowing in the thermoelectric controller is controlled in linear, as shown in FIG. 4, the voltage between 0 to the power supply voltage $V_{CC}$ is generated between the collector and the emitter of the bipolar transistor or between the drain and the source of the FET. This voltage drop causes the heat generation of the transistor or the FET. Therefore, the transistor or the FET dissipates heat greater than what is consumed by the thermoelectric controller, thereby reducing the power efficiency. The thermoelectric controller in this case, the switching noise does not occur in principle because the controller is not operated in switching mode.

Therefore, one object of the present invention is, by solving both problems appeared in the former reference and also in the latter reference, to provide a temperature control circuit for a light-emitting device, in which the circuit has the improved power efficiency and does not show switching noise without enlarging the size of the circuit.

SUMMARY OF THE INVENTION

According one aspect of the present invention, a temperature control circuit is provided for controlling a semiconductor device. The temperature control circuit of the invention includes a thermoelectric controller, a temperature sensing device, and a thermoelectric controller driver circuit. The thermoelectric controller, which is driven by the thermoelectric controller driver circuit, controls a temperature of the semiconductor device detected by the temperature-sensing device. The thermoelectric controller driver circuit includes a current driver, a voltage controller and a temperature controller. The current driver sets the direction of the current flowing between two terminals of the thermoelectric controller. The voltage controller controls the voltage supplied to the current driver. The temperature controller, by comparing the temperature of the semiconductor device with a target temperature, outputs a current direction control signal that decides the direction of the current flowing between two terminals of the thermoelectric controller. In the temperature control circuit of the present invention, the DC voltage supplied to the current driver varies depending on the current flowing in the thermoelectric controller.

The DC voltage supplied to the current driver is preferably a sum of a voltage induced to the thermoelectric controller and a first reference voltage. It is further preferable that the first reference voltage is adjusted depending on the current flowing in the thermoelectric controller.

The voltage controller includes a reference voltage generator, an adder, a comparator, and an adjusting block. The reference voltage generator, based on a command provided outside of the temperature control circuit, generates the first reference voltage. The adder adds a voltage induced between two terminals of the thermoelectric controller and the first reference voltage. The comparator generates an error signal by comparing added signal with the DC voltage supplied to the current driver. The adjusting block adjusts the DC voltage so as to set the error signal to be zero. Accordingly, the DC voltage coincides with the summed voltage applied to the thermoelectric controller and the first reference voltage.

In the present invention, the adjusting block may include a clock generator, a modulator and an output block. The clock generator generates a reference clock with a constant frequency and a triangular or a sawtooth wave. The modulator slices the reference clock output from the clock generator by the error signal provided from the comparator, and generates a pulse width modulated (PWM) signal, whose pulse width depends on the magnitude of the error signal. The output block amplifies and smoothes this PWM signal, and outputs as the DC voltage.

The temperature controller according to the present invention may include a temperature comparator, a loop filter, a current controller and a current direction controller. The temperature controller compares the temperature of the semiconductor device practically detected by the temperature sensing device with a target temperature preset outside of the temperature controller, and outputs an temperature error signal. The loop filter smoothes this temperature error signal. The current controller outputs the current control signal to the current driver, by which the current to be flowed in the thermoelectric controller is adjusted and decided in the direction thereof.

The current driver may include first and second circuits, each comprising an n-type transistor and a p-type transistor connected in series to the n-type transistor. The thermoelectric controller is connected between the first and the second circuits. The current to be flowed in the thermoelectric controller is decided in the direction thereof by turning on a pair of transistors including the n-type transistor of the first circuit and the p-type transistor of the second circuit, or turning on the other pair of transistors including the p-type transistor of the first circuit and the n-type transistor of the second circuit. Further, the level of control signal input to the base of respective transistors decide the magnitude of the current to be flowed in the thermoelectric controller.

DETAILED DESCRIPTION OF PREFERRED EMBODIMENTS

Figure 1:
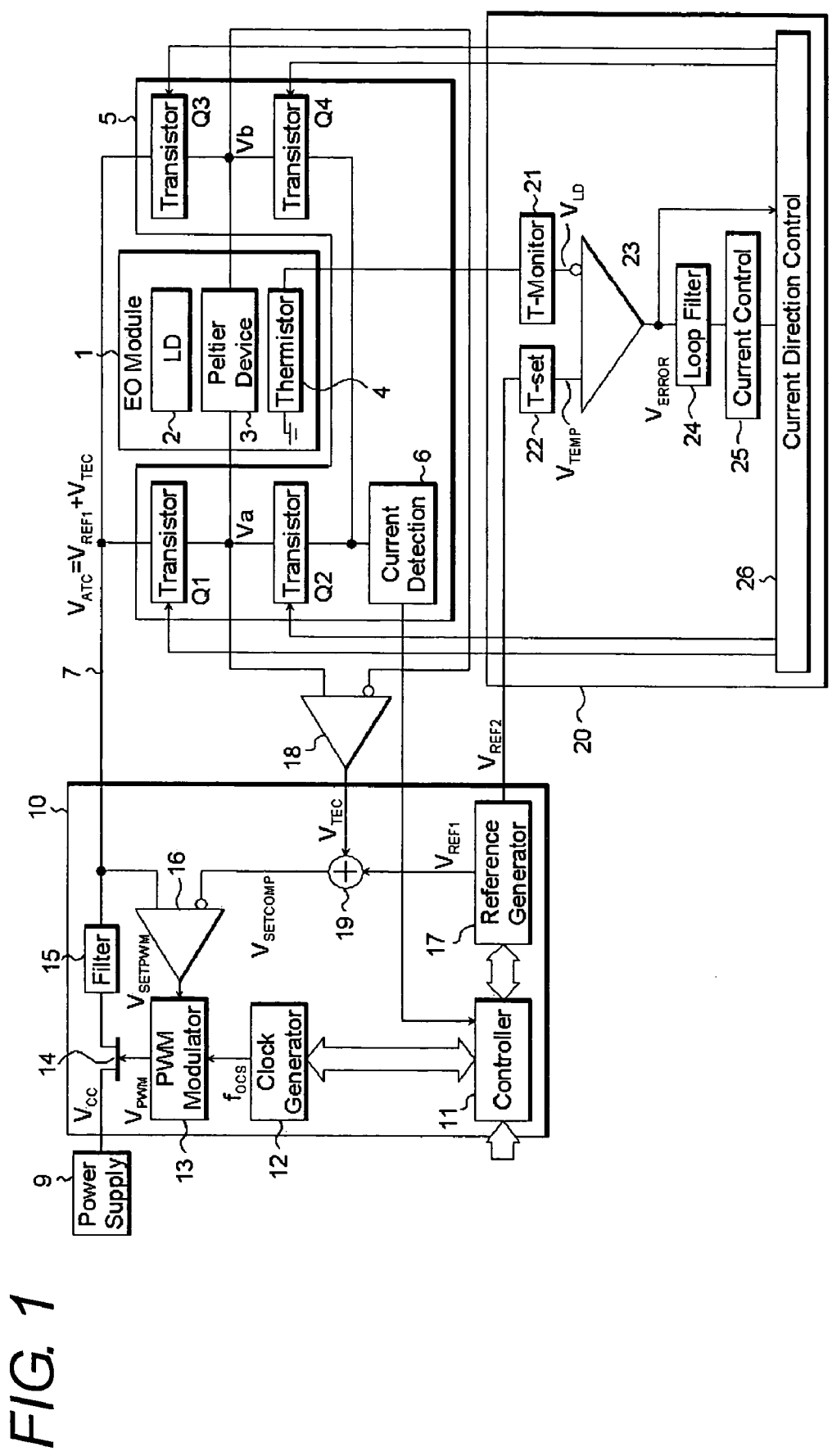
FIG. 1 is a block diagram of a control circuit according to the present invention.

Next, preferred embodiments of the present invention will be described as referring to accompanying drawings. FIG. 1 is a block diagram of the temperature controlling circuit according to the present invention.

An E/O module 1 provides a laser diode 2, a Peltier device 3 and a thermistor for monitoring a temperature of the laser diode 2. The Peltier device 3 and the thermistor 4 are placed immediate to the laser diode 2. The thermistor 4 detects the temperature of the Peltier device 3, and the laser diode 2 is heated up or cooled down by heating or cooling the Peltier device 3 depending on the direction of the current supplied thereto. The temperature-monitoring device is not restricted to the thermistor. A diode or a temperature-sensitive resistor may be an alternate.

A thermoelectric controller (hereinafter denoted as TEC) current driver 5 provides transistors, Q1 and Q2, connected in series to a current detection block 6 between a power line 7 and a ground, and another transistors Q3 and Q4, also connected in series to the current detection block 6. The transistors Q1 to Q4 may be a bipolar transistor or a field effect transistor. When bipolar transistors are used, the transistor Q1 is a pnp-type and the other transistor Q2 is an npn-type. The same situation for the type of the transistor is applied to the other pairs of transistors, Q3 and Q4. On the other hand, when field effect transistors are used, the transistor Q1 may be a p-type FET while the transistor Q2 may be an n-type FET. The same situation may be applied to the other transistors, Q3 and Q4. The current detection block 6 is provided for detecting the current flowing in the transistors Q1 to Q4.

Current control signals provided from a current direction control block 26, which will be described later, are input to bases or gates for each transistor Q1 to Q4. The transistors, operating as a switch, cause a voltage drop between the collector and the emitter (or between the drain and the source for the field effect transistor), whereby the voltage, Va and Vb, applied to both terminals of the Peltier device 3 may be adjusted. Thus, the Peltier device 3 is controlled by the TEC current driver 5 to flow the current depending on the voltage difference of Va and Vb.

In the case that only one of the operation, the heating up or the cooling down, is carried out, since the current should be only one way for the Peltier device 3, the TEC current driver 5 may include only one pair of transistors, Q1 and Q4, or Q2 and Q3.

The absolute difference between both terminals of the Peltier device 3, $V_{TEC}=|Va-Vb|$, is sensed by a Peltier voltage detector 18 and an output thereof is input to the voltage controller 10. The voltage of the power line 7 is optimized based on the output of the Peltier voltage detector 18 and a first reference voltage $V_{REF1}$.

Next, the operation in the voltage controller 10 will be described. The voltage controller 10 includes a clock generator 12, a PWM modulator 13, a field effect transistor FET 14 for switching the output from an external DC power supply 9, a filter 15, a comparator 16, a reference voltage generator 17 and an adder 19. The voltage controller 10 outputs a DC voltage $V_{ATC}$ on the power line 7 by adjusting the output of the external DC power supply 9.

The controller 11 sets two reference voltage $V_{REF1}$ and $V_{REF2}$ in the reference voltage generator 17, and also sets the reference clock $f_{OCS}$ in the clock generator 12. The first reference voltage $V_{REF1}$ is provided for setting the DC voltage $V_{ATC}$ on the power line 7 to a minimum target value, and it is defined based on a saturation voltage of transistors Q1 to Q4 in the TEC current driver 5. The first reference voltage $V_{REF1}$ is added to the Peltier voltage $V_{TEC}$ at the adder 19, and converted to the DC target value $V_{SETCOMP}$. The PWM modulator 13, the FET 14 and the filter 15 operate such that the DC output of the DC voltage controller 10 on the power line 7 coincides with this DC target value $V_{SETCOMP}$.

The controller 11 also sets a target temperature to the temperature setting block 22. In FIG. 1, the target temperature is decided by the second reference voltage $V_{REF2}$ from the reference voltage generator 17. Further, the controller 11 may provide an interface, which is not shown in FIG. 1, for communicating with a host device. The host device may set these voltage reference, $V_{REF1}$ and $V_{REF2}$, via this interface.

Figure 2:
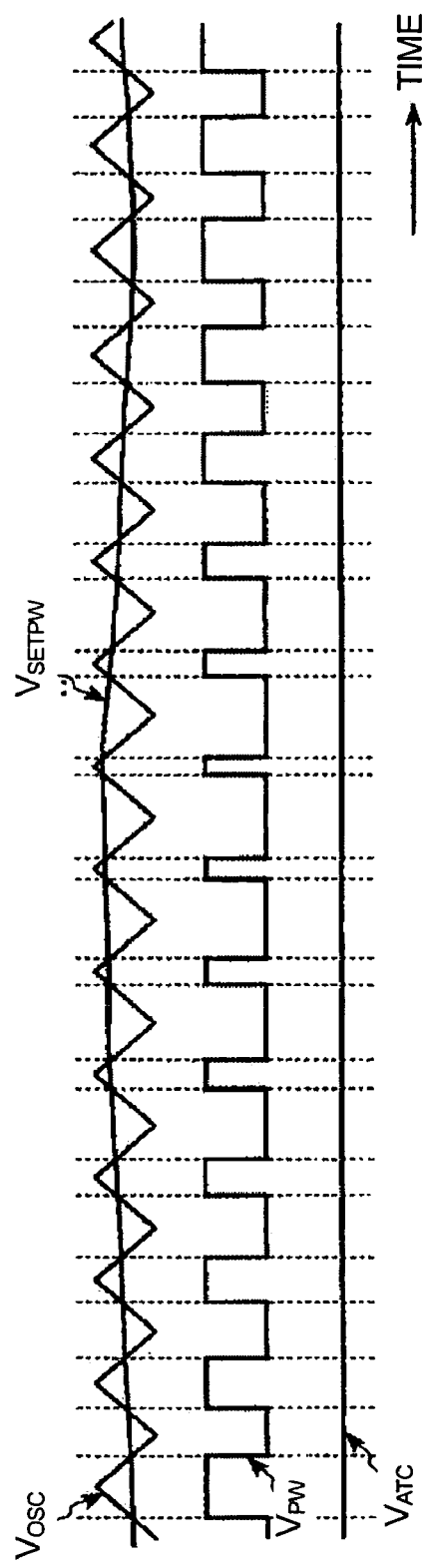
FIG. 2 shows waveforms of respective outputs in the voltage controller.

The reference clock $f_{OCS}$ is typically a triangular wave shown in FIG. 2, but a saw tooth wave may be applicable. The PWM modulator 13 provides a PWM modulated signal $V_{PWM}$, a pulse duration of which varies depending of the comparison between the reference clock $f_{OCS}$ and the error voltage $V_{SETPWM}$ as shown in FIG. 2, to the gate of the FET 14.

The FET 14 switches the DC voltage $V_{CC}$ from the external power supply 9 by the PWM modulated signal $V_{PWM}$. The filter 15 smoothes thus switched rectangular wave to the DC voltage $V_{ATC}$ as shown in FIG. 2, and this DC voltage $V_{ATC}$ is provided on the power line 7 and to the comparator 16. The DC voltage $V_{ATC}$ varies such that it becomes large when the pulse width of the rectangular wave output from the PWM modulator 13 is large, namely a portion of the high level of the pulse becomes large, while it becomes small when the pulse width is small. The comparator 16 compares the DC voltage $V_{ATC}$ with the DC target value $V_{SETCOM}$ and outputs the error voltage $V_{SETPWM}$ to the PWM modulator 13.

Thus, the voltage controller 10 keeps the DC voltage $V_{ATC}$ provided on the power line 7 to be the voltage difference $V_{TEC}$ between the terminals of the Peltier device 3 added to the first reference voltage $V_{REF1}$, $V_{ATC}=V_{REF1}+V_{TEC}$. Therefore, when the first reference voltage $V_{REF1}$ is kept constant, a load line of each transistor of the TEC current driver 5 may be drawn as denoted by a line A in FIG. 3.

Figure 3:
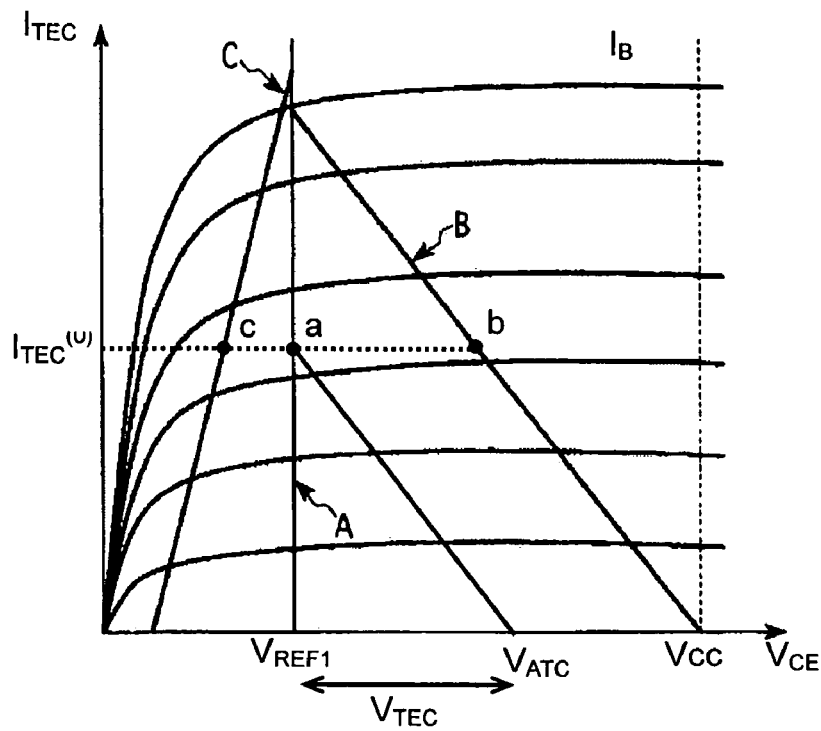
FIG. 3 shows an operating point of the transistor in the current driver of the present invention and that of the conventional controller.

In FIG. 3, the horizontal axis denotes to the voltage between the collector and the emitter $V_{CE}$, or that between the drain and the source $V_{DS}$ in the case of the FET, while the vertical axis denotes the current $I_{TEC}$ flowing in the Peltier device 3. Each curved line corresponds to the base current $I_B$, or the bias voltage between the gate and the source $V_{GS}$ in the case of the FET, of the transistor in the TEC current driver 5. The line B corresponds to a load line of a conventional TEC driver circuit.

In the conventional TEC driver, a constant supply voltage $V_{CC}$ is provided to the TEC current driver circuit. That is, the operation of the TEC current driver circuit operates can be described as the static characteristic of a transistor that has the Peltier device as a load. To flow a preset current in the Peltier device 3, the operating point of the transistor, which is shown as a symbol b, positions on the load line drawn from the power supply voltage $V_{CC}$. The power dissipation of the transistor is a product of the collector-emitter voltage $V_{CE}$ multiplied by the current flowing in the transistor, namely, flowing the Peltier device.

On the other hand, according to the TEC driver of the present invention, the power supply voltage applied to the Peltier device is varied, and the first reference voltage $V_{REF1}$ is set as the collector-emitter voltage for the transistor necessary to flow the minimum current in the Peltier device. Accordingly, the operating point of the transistor is set to the point "a" on the load line A in FIG. 3. When the current $I_{TEC}^{(0)}$ is to be flowed in the Peltier device 3, the conventional driver with a fixed power supply voltage sets the operating point of the transistor to the point "b" on the load line "B", while the driver of the present invention sets the operating point to the point "a" on the load line "A". A line drawn in parallel to the load line B from the point "a" gives the DC voltage $V_{ATC}$ supplied to the TEC driver circuit 5 at the point intersecting the horizontal axis, and the difference between the DC voltage $V_{ATC}$ and the first reference voltage $V_{REF1}$ gives the voltage difference $V_{TEC}$ applied to the Peltier device. In this condition, the power dissipation of the transistor is gives as $V_{REF1}*I_{TEC}^{(0)}$, which is improved by $(V^{CE}-V_{REF1})*I_{TEC}^{(0)}$ compared to the conventional driver.

Setting the first reference voltage $V_{REF1}$ such that it varies as the current $I_{TEC}$ for driving the Peltier device as a line C shown in FIG. 3, further improvement may be obtained in the power efficiency. That is, the operating point of the transistor varies depending on the TEC drive current $I_{TEC}$ such that it lies on a boundary between the saturation region and the proportional region of the transistor, whereby the further decrease of the power dissipation, i.e. the further improvement of the power efficiency, may be obtained. Under this condition, the operating point of the transistor moves from the point "a" to the point "c" in FIG. 3, and the DC voltage is given by $V_{ATC}'$. Although the power dissipation of the Peltier device is unchanged, that of the transistor may be further reduced. In FIG. 3, the boundary between the saturation region and the proportional region is denoted as the line "C", further enhancement in the power efficiency at a region of the low driver current may be anticipated by replacing the line to a curved line, such as an exponential curve.

Figure 4:
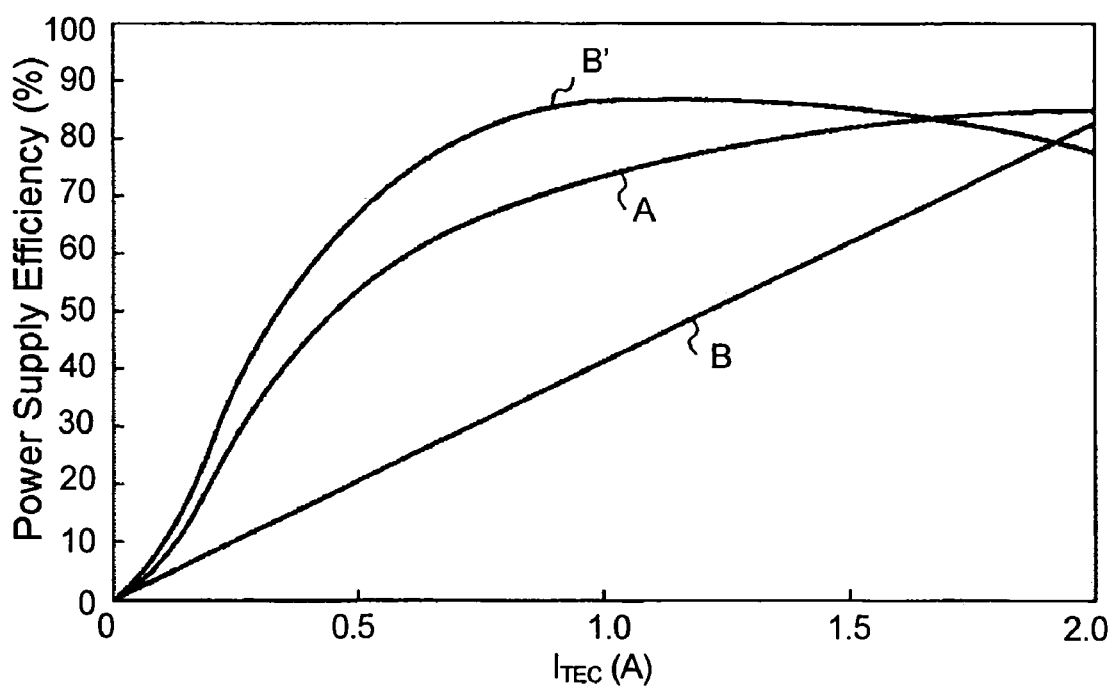
FIG. 4 shows a power efficiency of the present controller compared with that of the conventional controller.

According to the present feedback control, in which the DC voltage applied to the TEC current driver 5 is varied, the efficiency of the power supply becomes the line A in FIG. 4. Where the horizontal axis of FIG. 4 denotes the TEC drive current $I_{TEC}$, and the vertical axis corresponds to the power supply efficiency. The line "B" and the other line B in FIG. 4 corresponds to the conventional control and that using the PWM control, respectively. Although not exceeding the conventional PWM driver (B'), but exactly speaking, the present controller shows a superior characteristic in a range of the TEC drive current over 1.7[A], the present may be far superior in the power supply efficiency to the conventional driver (B). However, the PWM control is necessary for a large scale circuit to escape from switching noise thereof.

Next, the temperature control of the laser diode performed by the temperature controller 20 will be described. The temperature controller 20 generates the current control signal to transistors from Q1 to Q4 based on the temperature sensed signal from the thermistor 4 and the second reference voltage $V_{REF2}$ from the reference voltage generator 17. The temperature controller 20 includes a temperature-monitoring block 21, a temperature-setting block 22, a comparator 23, a loop filter 24, a current controller 25 and a current direction controller 26. The current controller 25 and the current direction controller 26 are driven by the DC voltage $V_{ATC}$ on the power line 7.

The temperature-monitoring block 21 receives the temperature sensed signal of the laser diode 2 from the thermistor 2, and the second reference voltage $V_{REF2}$, which corresponds to the target temperature of the laser diode 2, from the reference voltage generator 17. The temperature-monitoring block 21 monitors the temperature of the laser diode 2 and outputs the monitored result as a signal $V_{LD}$. The temperature-setting block receives the second reference voltage $V_{REF2}$, and outputs a signal $V_{TEMP}$ corresponding to the target temperature of the laser diode 2.

The monitored signal $V_{LD}$ and the target temperature $V_{TEMP}$ are compared by the comparator 23, and an error voltage $V_{ERROR}$ is output to the loop filter. The comparator 23 also outputs a switching signal $I_{TECD}$ to the current direction control 26 for switching the direction of the TEC current flowing in the Peltier device 3 based on the comparison of the temperature monitoring signal $V_{LD}$ and the target temperature $V_{TEMP}$.

Figure 5:
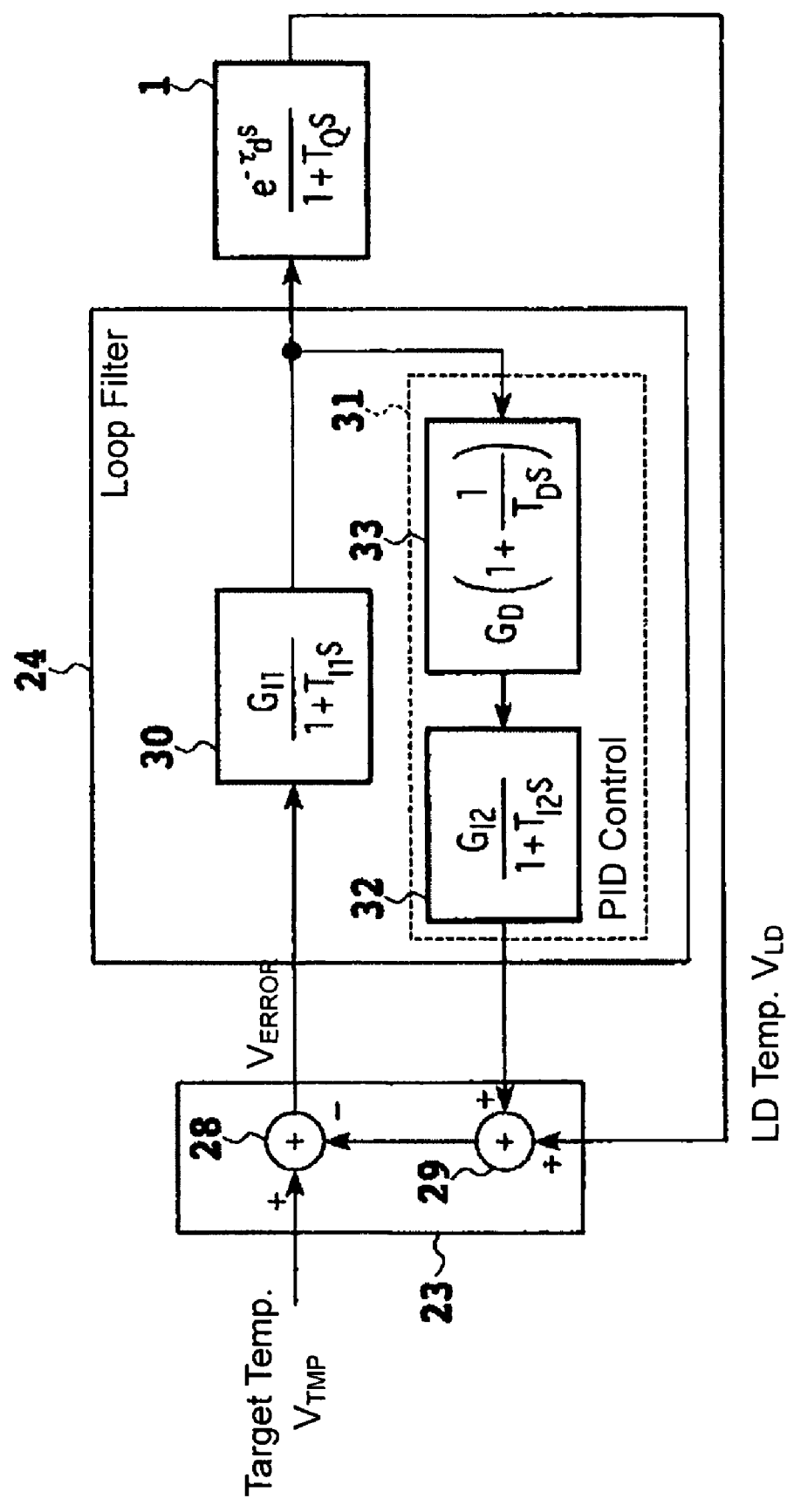
FIG. 5 is a diagram showing a characteristic of the loop filter of the present invention.

The loop filter 24 is provided for the negative feedback control to the thermal response of the E/O module 1. This negative feedback loop is described as referring to FIG. 5. FIG. 5 shows a transfer characteristic of the feedback loop, which is not always coincident with a block diagram of a practical hardware.

As shown in FIG. 5, the loop filter 24 includes a PID compensator 31, which includes an integrator 32 and a differentiator 33, and a primary integrator 30. The negative feedback loop is configured with this loop filter 24 and two adders, which are included in the compactor 23 of the temperature controller 20. Circuit elements shown in FIG. 5 have respective transfer characteristics shown within FIG. 5, and these characteristics are decided so as to show a closed loop performance taking the thermal response of the E/O module 1 into account. That is, that the PID controller is provided for compensating the instability of the response of the E/O module 1, because the time constant $\tau_d$ is enough greater than the time constant $T_{11}$. The present circuit may provide the current control signal to the TEC current driver 5, which is compensated in phase to the thermal response of the E/O module 1.

Parameters shown in FIG. 5 are as follows:

$T_{11}$: time constant of the primary integrator 30
$T_{12}$ time constant of the integrator 32
$T_D$: time constant of the differentiator 33
$T_q$: time constant of the thermal response of the E/O module 1
$\tau_d$: time delay of the thermal response of the E/O module 1
$G_{11}$ gain of the primary integrator 30
$G_{12}$ gain of the integrator 32
$G_D$: gain of the differentiator 33

The current controller 25, provided by the output compensated in phase from the loop filter 24, generates a control signal $V_{CNT}$ corresponding to the magnitude of the drive current to be flowed in the Peltier device 5 to the current direction controller 26.

The current direction controller 26, depending on which transistors to be turned on and which transistors to be turned off in order to set the temperature of the E/O module 1 to the target temperature, based on a current direction control signal $I_{TECD}$ obtained by the comparison between the monitor signal $V_{LD}$ corresponding to the practical temperature and the target temperature $V_{TEMP}$, provides the control signal $V_{CNT}$ to the base or the gate of the predetermined transistor.

Figure 6B:
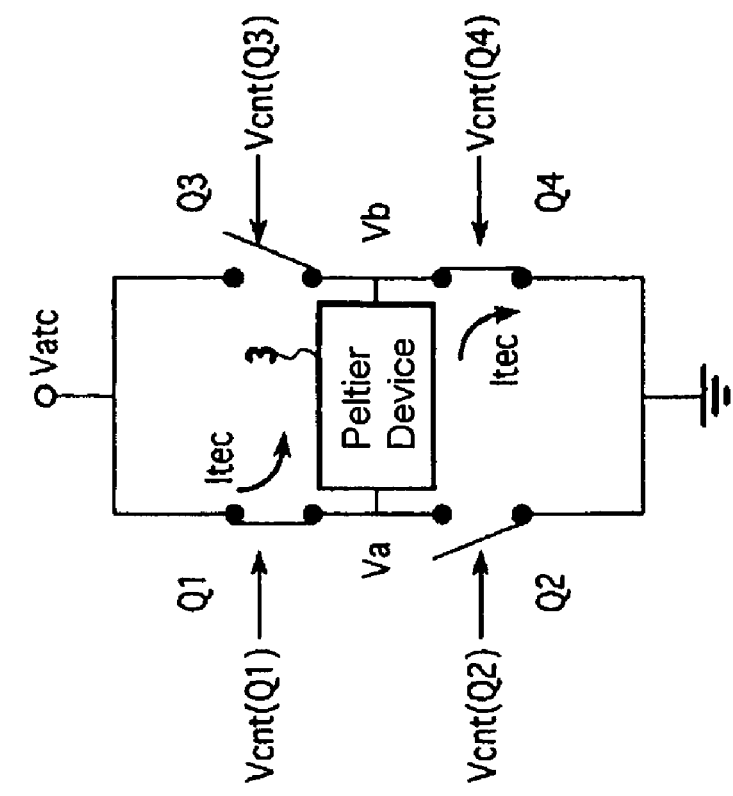
FIG. 6A and FIG. 6B show switching configurations of the present current driver.
Figure 6A:
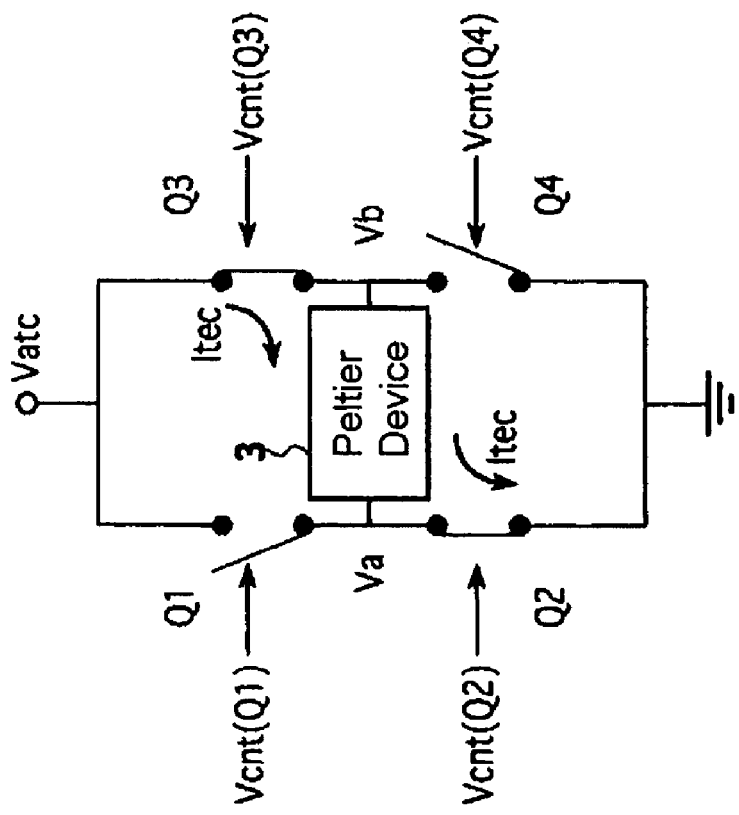

When the detected temperature is lower than the target temperature and the E/O module 1 is necessary to be heated up, as shown in FIG. 6A, transistors Q1 and Q4 are turned off while transistors Q2 and Q3 are turned on. Accordingly, the driver current $I_{TEC}$ flows in the Peltier device from the right hand side to the left hand side in FIG. 6A through the transistors Q2 and Q3. Due to the current $I_{TEC}$ so flowing, the Peltier device is heated up and the E/O module 1 is so operated.

On the other hand, when the practical temperature is higher than the target temperature and the E/O module 1 is necessary to be cooled down, as shown in FIG. 6B, transistors Q2 and Q3 are turned off while transistors Q1 and Q4 are turned on. Accordingly, the drive current $I_{TEC}$ flows in the Peltier device 3 from the left hand side to the right hand side of FIG. 6B. Because of the current $I_{TEC}$ flowing in this direction, the Peltier device 3 operates in endothermic for the E/O module 1.

When the Peltier device is heated up, the base bias for each transistor is as follows:

$$V_{CNT}(Q1)=V_{ATC}$$

$$V_{CNT}(Q2)\approx 0\sim(V_{ATC}-V_{TEC})/2=0\sim V_{REF1}$$

$$V_{CNT}(Q3)\approx V_{ATC}\sim\{V_{ATC}-(V_{ATC}-V_{TEC})/2\}=V_{ATC}\sim(V_{ATC}-V_{REF1})$$

$$V_{CNT}(Q4)=0,$$

while the Peltier device is cooled down, the base bias for each transistor becomes:

$$V_{CNT}(Q1)=V_{ATC}\sim\{V_{ATC}-(V_{ATC}-V_{TEC})/2\}=V_{ATC}\sim(V_{ATC}-V_{REF1})$$

$$V_{CNT}(Q2)\approx 0$$

$$V_{CNT}(Q3)\approx V_{ATC}$$

$$V_{CNT}(Q4)=0\sim(V_{ATC}-V_{TEC})/2=0\sim V_{REF1}.$$

Since transistors Q1 and Q3 are the pnp-type transistor (or p-type FET), the transistors Q1 and Q3 turn off by raising their base bias $V_{ATC}$. On the other hand, since the transistor Q2 and Q4 are the npn-type transistor (or n-type FET), the transistors Q2 and Q4 turn off by pulling down their base bias to the ground. Further, in the mode when transistors Q2 and Q4 turn on, the base bias is set such that the collector-emitter voltage $V_{CE}$ to be the first reference voltage $V_{REF1}$, and the base bias is between 0V to the first reference voltage $V_{REF1}$.

Thus, according to the present invention, since the current direction is switched to heat up or cool down based on the detection of the practical temperature of the laser diode, the transistor operates in linear (in analog) not switching. Accordingly, it is not necessary to pay attention to the switching noise, and the size of the controller circuit can be reduced because it is not necessary to provide a filter with large scale for reducing the noise.

What is claimed is:

1. A temperature control circuit for controlling an operating temperature of a semiconductor device, comprising:
    a thermoelectric controller for mounting said semiconductor device, said thermoelectric controller having two terminals and heating up or cooling down said semiconductor device by flowing a current between said two terminals of said thermoelectric controller;
    a temperature-sensing device for monitoring a temperature of said semiconductor device; and
    a thermoelectric controller driver circuit including,
    a current driver for controlling a direction of said current flowing between said two terminals of said thermoelectric device,
    a voltage controller for controlling a DC voltage provided to said current driver, and
    a temperature controller, by comparing said temperature of said semiconductor device with a target temperature, for outputting a current direction control signal to said current driver to set said direction of said current flowing in said thermoelectric controller,
    wherein said DC voltage provided to said current driver varies depending on said current flowing in said thermoelectric controller.

2. The temperature control circuit according to claim 1, wherein said semiconductor device is a semiconductor laser diode.

3. The temperature control circuit according to claim 1, wherein said current driver comprises,
    a first circuit includes an n-type transistor and a p-type transistor connected in series to said n-type transistor,
    a second circuit includes an n-type transistor and a p-type transistor connected in series to said n-type transistor,
    wherein said thermoelectric controller is connected between said first circuit and said second circuit, and said direction of said current flowing in said thermoelectric controller is switched by turning on said n-type transistor of said first circuit and said p-type transistor of said second circuit or said p-type transistor of said first circuit and said n-type transistor of said second circuit.

4. The temperature control circuit according to claim 3, wherein
    said n-type transistor is an npn-type bipolar transistor, and said p-type transistor is a pnp-type bipolar transistor.

5. The temperature control circuit according to claim 3, wherein
said n-type transistor is an n-type field effect transistor, and said p-type transistor is a p-type field effect transistor.

6. The temperature control circuit according to claim 1, wherein said DC voltage is a sum of an induced voltage to be generated between said two terminals of said thermoelectric controller and a first reference voltage.

7. The temperature control circuit according to claim 6, wherein said first reference voltage varies depending on said current flowing in said thermoelectric controller.

8. The temperature control circuit according to claim 6, wherein said temperature controller includes,
   a temperature comparator for outputting an temperature error signal by comparing said temperature detected by said temperature sensing device with a target temperature,
   a loop filter, by inputting said temperature error signal, for outputting a current control signal,
   a current controller, by inputting said current control signal, for outputting a drive signal for driving said current driver, and
   a current direction controller, by inputting said drive signal, for outputting said current direction control signal,
   wherein said temperature controller controls a magnitude and a direction of said current flowing in said current driver.

9. The temperature control circuit according to claim 6, wherein said voltage controller further includes,
   a reference voltage generator for generating said first reference voltage,
   an adder for adding said induced voltage generated between said two terminals of said thermoelectric controller to said first reference voltage, said adder outputting an added signal,
   a comparator for generating an error signal by comparing said added signal with said DC voltage, and
   an adjusting block for adjusting said DC voltage depending on said error signal.

10. The temperature control circuit according to claim 9, wherein said adjusting block further includes,
    a clock generator for generating a reference clock,
    a modulator, by inputting said reference clock and said error signal output from said comparator, for generating a PWM signal whose pulse width is modulated by said error signal, and
    an output block comprising a transistor for amplifying said PWM signal and a filter for smoothing an output of said transistor, said output block outputting said DC voltage depending on said pulse width of said PWM signal.

11. The temperature control circuit according to claim 10, wherein said reference clock is a triangular wave.

12. The temperature control circuit according to claim 10, wherein said reference clock is a sawtooth wave.

* * * * *